(12) United States Patent
Pottier (10) Patent No.: US 6,494,309 B2
(45) Date of Patent: Dec. 17, 2002

(54) STACK SUPPORT LOADING AND/OR OFFLOADING SYSTEM AND A CORRESPONDING LOADING AND/OR OFFLOADING SYSTEM

(75) Inventor: Fabrice Pottier, Chelles (FR)

(73) Assignee: Les Machines Dubuit, Noisy le Grand (FR)

( * ) Notice: Subject to any disclaimer, the term of this patent is extended or adjusted under 35 U.S.C. 154(b) by 0 days.

(21) Appl. No.: 09/911,536

(22) Filed: Jul. 25, 2001

(65) Prior Publication Data

US 2002/0048507 A1 Apr. 25, 2002

(30) Foreign Application Priority Data

Jul. 25, 2000 (FR) .......................................... 00 09730

(51) Int. Cl.$^7$ ............................................... B65G 29/00
(52) U.S. Cl. .................... 198/468.9; 198/468.01
(58) Field of Search ....................... 198/468.01, 468.6, 198/468.9, 346.2, 468.11; 414/789.9, 790.4

(56) References Cited

U.S. PATENT DOCUMENTS

| 4,256,216 A | | 3/1981 | Winters et al. | |
| 4,397,600 A | | 8/1983 | Jacubowiez | |
| 4,527,936 A | * | 7/1985 | Hartlieb | .................... 414/790.4 |
| 4,787,806 A | | 11/1988 | Aupperle | |
| 5,092,449 A | | 3/1992 | Bolin et al. | |
| 5,195,866 A | * | 3/1993 | Hasegawa et al. | ... 198/468.9 X |
| 5,226,523 A | * | 7/1993 | Kawakami et al. | .. 198/468.9 X |
| 5,483,876 A | * | 1/1996 | Davis et al. | ......... 198/468.6 X |

FOREIGN PATENT DOCUMENTS

| FR | 2 570 134 | 3/1986 |
| FR | 2 714 867 | 7/1995 |

* cited by examiner

Primary Examiner—James R. Bidwell
(74) Attorney, Agent, or Firm—Young & Thompson (57) ABSTRACT

A stack support loading and/or offloading system includes a carriage mobile in translation between a retracted position in which the carriage is moved away from the machine and an advanced position in which the carriage is close to the machine, the direction of movement of the carriage being substantially horizontal. An arm pushes or pulls a support, having at its free end a shape suitable for the support to be moved, and mounted on the carriage and articulated about a substantially vertical shaft between a deployed position in which the free end of the arm is on the trajectory of a support and a retracted position folded toward the carriage. A spring return system spring-loads the arm toward its deployed position. Applications include a loading and offloading station, for example for a machine for printing compact discs.

16 Claims, 5 Drawing Sheets

STACK SUPPORT LOADING AND/OR OFFLOADING SYSTEM AND A CORRESPONDING LOADING AND/OR OFFLOADING SYSTEM

BACKGROUND OF THE INVENTION

1. Field of the Invention

The present invention relates to a system for loading and/or offloading objects that can be stacked and a loading and/or offloading station including this kind of system.

2. Description of the Prior Art

The present invention relates, for example, to loading and unloading supports for stacks of objects that can be stacked for use in a machine for printing the objects. The stack supports usually pass first through a loading station which moves a stack support from a conveyor belt or similar conveyor to a transfer station. At the transfer station the objects are unstacked to place them on the printing machine. The transfer system includes a robot, for example, with holding means for picking up a stacked object to put it down at a station of the printing machine.

An object of the present invention is to provide the simplest possible loading and/or unloading system between a system for feeding stacked object supports and a machine. The same system in accordance with the invention preferably loads and unloads stacked object supports.

SUMMARY OF THE INVENTION

To this end, the present invention proposes a system between a conveyor and a machine for loading and/or offloading a support for objects adapted to be stacked.

According to the invention, the system includes:

a carriage mobile in translation between a retracted position in which the carriage is moved away from the machine and an advanced position in which the carriage is close to the machine, the direction of movement of the carriage being substantially horizontal, an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and a spring return system spring-loading the arm toward its deployed position.

This provides a ratchet system of simple design that is easy to use. It suffices to orient the carriage substantially in the loading or offloading direction. In an initial position, the arm is positioned relative to a support to be moved and then, when the carriage moves, the support is entrained with the carriage toward its destination. At the end of the travel of the carriage, the support is no longer entrained and the carriage returns to its initial position. If during this return movement to the initial position the arm encounters a new support brought up by a conveyor, it folds toward the carriage and passes the obstacle without being impeded. Because of the return spring system, the arm returns automatically to its deployed position and is therefore in the correct position to entrain the new support with it the next time the carriage moves.

In some machines there is a difference in height between the plane in which the objects, in this instance the supports, are conveyed and the working plane of the machine. In such cases, the system according to the invention has the carriage cooperate with a platform intended to receive the support for objects to be stacked when the latter is loaded onto the machine or offloaded from it, either the carriage or the platform having an inclined plane with which the other cooperates. The platform then serves as an elevator. In this advantageous embodiment it is not necessary to provide a "motor" for the elevator. The drive system of the loading and/or offloading device then moves the platform; either the carriage or the platform advantageously has an idler wheel adapted to cooperate with the inclined plane of the other one.

The loading and/or offloading system preferably includes a rotating transfer plate provided with housings each of which is adapted to receive a support adapted to be moved from the conveyor to the transfer plate or vice versa.

The present invention also proposes a loading and offloading system that includes two systems as described above, the carriages of the two systems being interconnected and moved by a common actuator. With this system a single actuator (piston and cylinder actuator, motor or the like) handles loading and offloading, which is highly advantageous. It saves space and reduces costs compared to prior art systems.

In one advantageous embodiment each carriage is mounted to slide on a guide rail and the two guide rails are fastened together by a base. The base is substantially triangular, for example. The carriages can then be placed on respective opposite sides of the base and their guide rails form two sides of the triangle. Each carriage is then advantageously connected by a link of variable length to a mobile central block moved by an actuator.

The mobile central block advantageously includes at the front, i.e. on the same side as the machine, an idler wheel adapted to cooperate with an inclined plane disposed under a platform intended to receive the support for objects to be stacked when the latter is loaded onto the machine or offloaded from it. There is then no need to provide a toothed wheel on each carriage.

The present invention also relates to a station for loading and offloading supports for objects intended to be stacked, the station including a conveyor, a rotating transfer plate provided with housings each adapted to receive a support, and a system for moving a support from the conveyor toward the transfer plate or vice versa.

In accordance with the invention, the system for moving a support includes a loading and/or offloading system as described above or a loading and offloading system as described above.

In the case of a loading and offloading station including a system for loading and offloading simultaneously and in which the supports to be moved each have a base having a circular cylindrical foot on which is placed a circular plate of greater diameter than the foot, the housings of the transfer plate adapted to receive a support advantageously open onto the periphery of the plate, thus providing a lateral opening for each housing, the resulting openings enabling radial introduction of a support foot but preventing radial introduction of a circular support plate. This kind of plate facilitates introducing supports onto the plate. The prior art plates have housings that do not open onto the periphery, which necessitate a relatively large vertical travel of the support to accommodate it on the plate, but the embodiment proposed here significantly limits the vertical movement necessary to place the support in its housing.

In this advantageous embodiment, each housing has a peripheral shoulder, defining two bores with different diameters; the larger diameter bore is adapted to receive a support plate with as little clearance as possible and the smaller diameter bore is adapted to receive a support foot. The support is therefore perfectly retained in its housing.

As already mentioned above, the loading and offloading station can include a platform under the transfer plate, facing the loading and offloading system, and having a substantially horizontal upper face adapted to receive a support and mobile in translation in a substantially vertical direction between a top position, in which the upper face of the platform is substantially in the plane in which the supports are conveyed, and a bottom position, in which the upper face is below a support foot, without touching the latter when the support is placed in its housing on the rotating plate.

The present invention also proposes a printing machine including a circular contour printing table which has a plurality of object-stations regularly distributed around its periphery each adapted to receive an object to be printed, a loading station and an offloading station, wherein at least one loading and/or offloading station includes a loading and/or offloading system as described above or a loading and offloading system as described above.

In the latter case, the printing machine advantageously includes two transfer plates, each transfer plate is advantageously associated with a loading and offloading system as described above, a conveyor is preferably provided for feeding supports to a first loading and offloading system, a system is advantageously provided for conveying empty supports offloaded from the first transfer plate by the first loading and offloading system to the second loading and offloading system in order to be loaded onto the second transfer plate, and a second conveyor is provided, for example, to transport away the filled supports offloaded from the second transfer plate by the second loading and offloading system.

The following description with reference to the accompanying diagrammatic drawings explains further the objects and advantages of the invention. It is clear that the description is given by way of example only and is not limiting on the invention.

DETAILED DESCRIPTION OF THE PREFERRED EMBODIMENT

The present invention is described hereinafter with reference to a printing machine like that shown in plan view in FIG. 5. Of course, a loading and/or offloading system according to the invention can be used with other machines.

Figure 5:
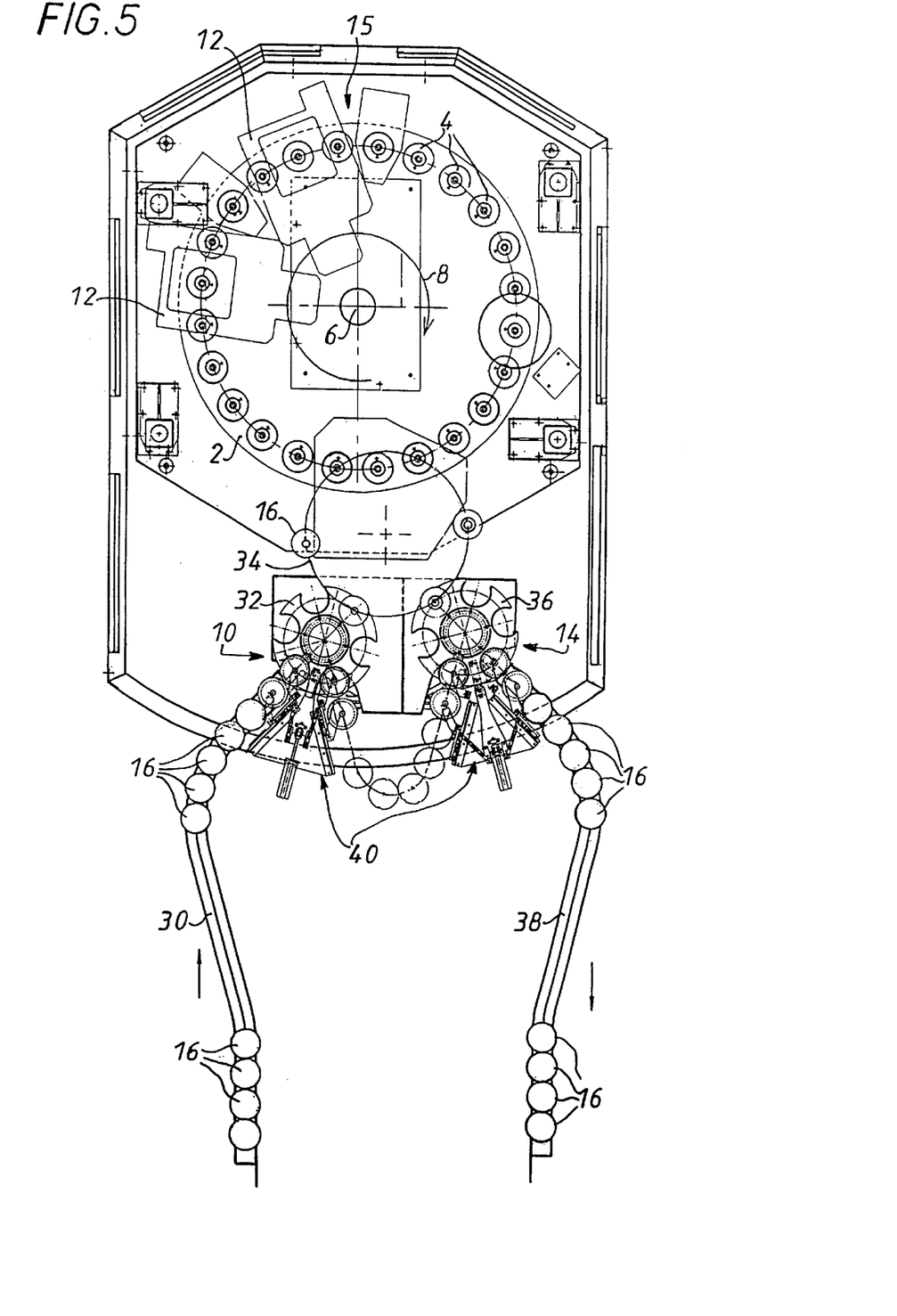
FIG. 5 is a plan view of a printing machine including two loading and offloading systems as shown in FIGS. 3 and 4, FIGS. 6 to 11 are diagrammatic views showing the loading of a support toward a transfer station.

The printing machine shown in plan view in FIG. 5 includes a circular contour printing table 2 which has a plurality of object-stations 4 regularly distributed around its periphery each adapted to receive an object to be printed (not shown); mounted to rotate stepwise about a vertical axis 6 passing through its center and perpendicular to its plane, and in practice vertical, it moves the object-stations 4 successively, for example in the clockwise example indicated by the arrow 8 in FIG. 5, to a loading station 10, a plurality of workstations 12 each including a printing system, and an offloading station 14.

Any kind of objects that can be stacked can be printed. In the embodiments shown they are in practice flat objects, to be more precise compact discs with a central opening.

Figure 2:
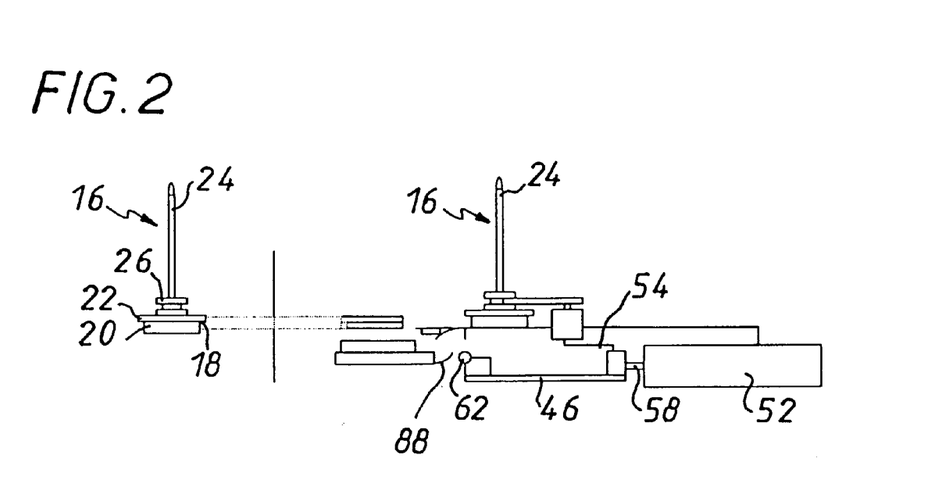
FIG. 2 is a diagrammatic view to a smaller scale of the system from FIG. 1.

Stack supports 16 are used for stacking these objects. As shown in FIG. 2, for example, a stack support 16 has a base 18 having a circular cylindrical foot 20 surmounted by a plate 22 and a pillar 24 fastened to the base 18, projecting axially therefrom and tapered at its upper end so that the central opening of objects to be printed can be threaded over it. A ring 26 is mounted to slide on the pillar 24.

The cylindrical foot 20 of the stack support 16 is a circular foot having a diameter less than the diameter of the plate 22, which is also circular. The ring 26 has a shape resembling that of a diabolo with a recessed area between two flanges.

This kind of stack support 16 is familiar to the skilled person because they are already widely used. In use, this kind of support carries a stack 28 of objects to be printed, the stack resting on the ring 26.

Because the printing machine does not of itself constitute the subject matter of the present invention, it is not described in detail here. The machine described in the document FR-2 714 867 substantially corresponds to the machine shown in FIG. 5, and can therefore be referred to for a description thereof.

As can be seen in FIG. 5, a conveyor 30 feeds the machine with stack supports 16. The stack supports 16 arriving on the conveyor 30 are then placed on a transfer plate 32. The stacked objects on the stack support are then unstacked from the stack support 16 by a stacker/unstacker robot 34 and placed on the object-stations 4 of the printing table 2. When the objects to be printed have been printed, they are taken up again from an object-station 4 of the printing table by the stacker/unstacker robot 34 to be placed on a stack support 16 housed on a second transfer plate 36 associated with the offloading station 14.

When a stack support 16 placed on the transfer plate 36 has been filled, the support 16 is then placed on the second conveyor 38, which conveys it to another machine.

The present invention is more particularly concerned with the systems for moving the stack supports 16 from a conveyor to a transfer plate and for removing a stack support from the transfer plate. A loading and offloading system 40 of this kind is associated with each of the loading station 10 and the offloading station 14.

Figure 3:
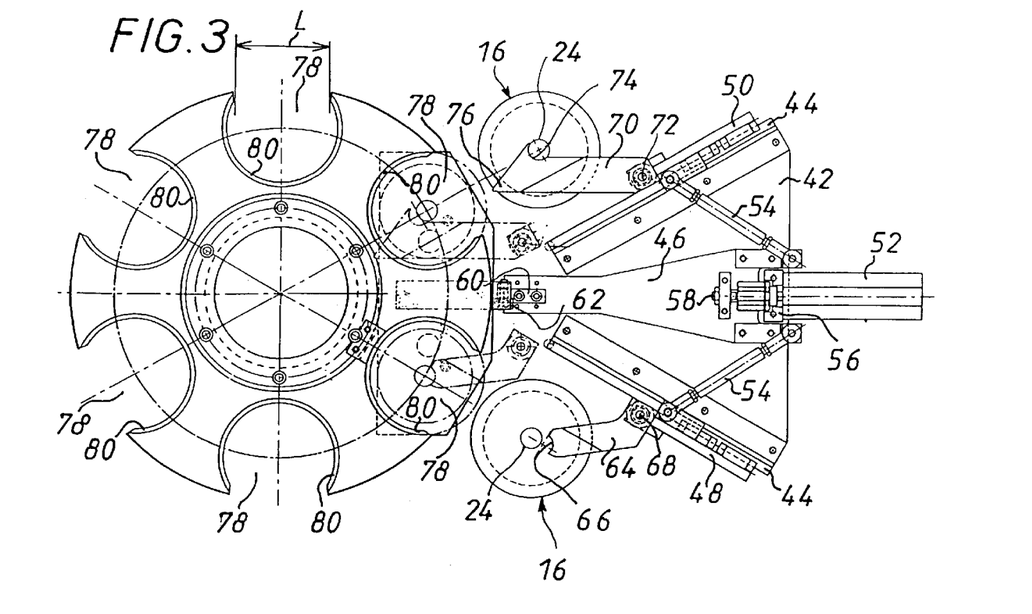
FIG. 3 is a plan view of a loading and offloading system according to the invention in a retracted position.
Figure 4:
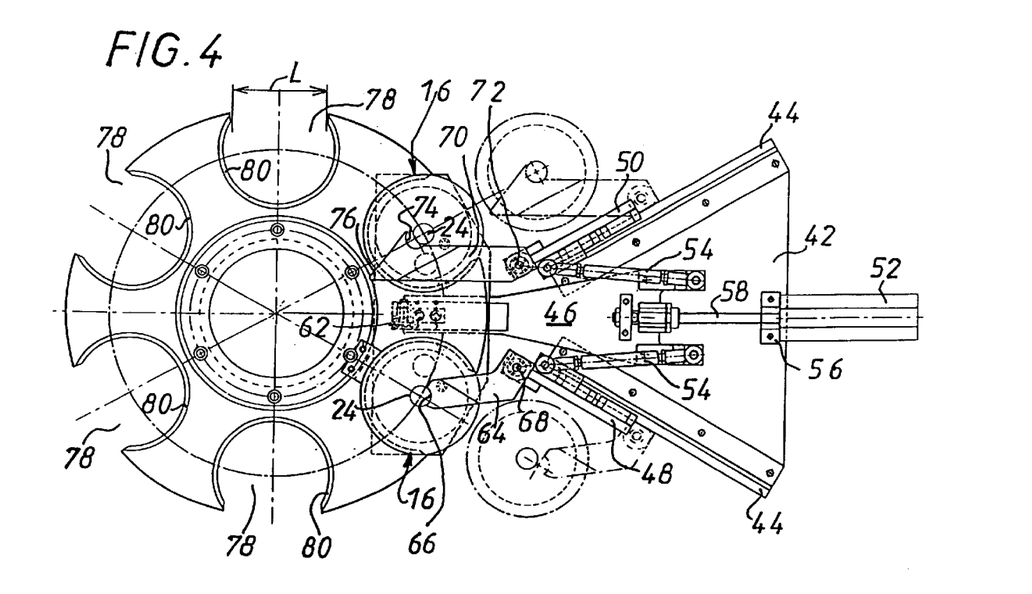
FIG. 4 is a view corresponding to FIG. 3 but in an advanced position.

Each loading and offloading system 40 includes a base 42 to which guide rails 44, a mobile central block 46, two mobile carriages 48 and 50 each guided on a guide rail 44, a piston and cylinder actuator 52 and links 54 connecting the mobile central block 46 to the carriages 48 and 50 are fixed.

The base 42 is substantially the shape of an isosceles triangle and is in a substantially horizontal plane. The two equal sides of the isosceles triangle converge toward the transfer plate 32 or 36 associated with the corresponding loading and offloading device 40. The guide rails 44 are mounted on the equal sides of the isosceles triangle. A flange 56 to which the piston and cylinder actuator 52 is fixed is mounted at the center of the base of the isosceles triangle.

The piston and cylinder actuator 52 includes a piston rod 58 connected at its free end projecting from the actuator to the mobile central block 46.

The mobile central block is elongate and extends substantially along the bisector defined by the guide rails 44. The block 46 has a nose 60 that extends beyond the guide rails 44 on the side of the corresponding rotating plate 32 or 36. A wheel 62 is mounted at the end of the nose 60 on the upper face of the mobile central block 46.

The links 54 are articulated to the mobile central block 46 and to the corresponding carriages 48 and 50. Each link 54 is articulated to the mobile central block 46 on the side opposite the corresponding transfer plate 32 or 36 and articulated to the mobile carriage 48 or 50 on the same side as the corresponding transfer plate 32 or 36. In this way, when the piston and cylinder actuator 52 pushes the mobile central block toward the transfer plate 32 or 36, the mobile carriages 48 and 50 are entrained along the corresponding guide rails 44.

The carriage 48 is adapted to load a stack support 16 onto a transfer plate. It carries an arm 64 whose shape is adapted to push the stack support toward the transfer plate. The arm 64 has a shape that is cranked toward the corresponding transfer plate. The free end of the arm 64 has a notch 66 to grasp a stack support 16 at the level of the recess formed in the ring 26. The arm 64 is cut out from flat plate, for example. It is disposed in a substantially horizontal plane and articulated about a substantially vertical axis 68. The conveyor that feeds the stack supports 16 toward the corresponding transfer plate is substantially parallel to the guide rail 44 of the carriage 48 near the transfer plate. The arm 64 is disposed at a height relative to the corresponding conveyor such that it is at the same level as the ring 26 of a stack support, to be more precise at the same level as the recess in that ring. Accordingly, when the carriage 48 advances toward the corresponding transfer plate, the notch 66 is interengaged with the recess of the corresponding ring 26 and the arm pushes the stack support 16 toward the transfer plate. Of course, the travel of the carriage 48 is sufficient to cause the required movement of the stack support.

As already indicated above, the arm 64 is mounted on the shaft 68, about which it can pivot between two extreme positions. A first extreme position corresponds to the position shown in FIGS. 3 and 4. In this position the notch 66 is on the trajectory of a ring 26 of a stack support 16 moving on a conveyor feeding the corresponding transfer plate. In the second extreme position the arm 64 is folded against the guide rail 44. This second position is not shown in the drawing. A return system, not shown in the drawing, integrated with the shaft 68, returns the arm 64 to its first extreme position, that shown in the drawing.

When the arm 64 has pushed a stack support toward the corresponding transfer plate and returned to its retracted position shown in full outline in FIG. 3, it can come into contact with a stack support arriving on the corresponding conveyor. Because it is articulated about the shaft 68, the arm can then fold and pass behind the new stack support 16 arriving on the corresponding conveyor. When it has passed the new stack support 16, the arm 64 is deployed again by the spring system integrated with the shaft 68 to assume the position shown in FIGS. 3 and 4. The system is then ready to push the new stack support 16 toward the corresponding transfer plate.

The carriage 50 has a substantially identical configuration. An arm 70 is articulated about a substantially vertical shaft 72. There is a notch 74 on the same side as the free end of the arm 70. The shape of the arm 70 is adapted to withdraw a stack support 16 on a transfer plate 32 or 36 and feed the support 16 toward a conveyor, for example the conveyor 38. The arm 70, which is also cut out from flat plate, is also in a substantially horizontal plane. It extends in a direction at an acute angle to the guide rail 44 corresponding to the carriage 50. The free end of .the arm 70 has on the same side as the transfer plate a point 76 and on the side opposite the transfer plate the notch 74 adapted to cooperate with a ring 26 of a stack support 16.

The arm 70 is also articulated between two extreme positions. The first extreme position corresponds to that shown in FIGS. 3 and 4. A second extreme position, not shown, corresponds to a position folded toward the guide rail 44. In the first extreme position the notch 74 is on the trajectory of the ring 26 of a stack support 16 placed on a conveyor for conveying the stack supports leaving the corresponding transfer plate.

As for the carriage 48, the guide rail 44 is substantially parallel to the end of the conveyor for conveying the stack supports leaving the corresponding transfer plate. FIG. 3 shows the carriage 50 in its retracted position, i.e. its position moved away from the corresponding transfer plate. To offset a stack support 16 from the transfer plate, the carriage 50 advances toward the transfer plate until it reaches the position shown in FIG. 4. During this movement the arm 70 strikes the stack support to be offloaded. Because of the point 76, the arm 70 is retracted and inclined toward the guide rail 44. A spring system integrated with the shaft 72 of the arm 70 returns the arm 70 to its extreme position away from the guide rail 44 and the notch 74 is then placed behind the ring 26 of the stack support 16 to be offloaded. Accordingly, when the carriage 50 returns to the position shown in FIG. 3, it entrains the corresponding stack support with it. Of course, the travel of the carriage 50 is sufficient to reach the stack support on the corresponding transfer plate and to move it onto the corresponding conveyor.

FIGS. 3 and 4 show clearly that one stack support 16 is loaded onto a transfer plate 32 or 36 at the same time as another stack support 16 is offloaded. This is achieved by a return movement of the mobile central block 46. FIG. 3 shows the mobile central block 46 in its retracted position. The carriages 48 and 50 are therefore also in their retracted position. The arms 64 and 70 are shown in full line in their deployed position corresponding to the retracted position of the carriages 48 and 50 and in chain-dotted line in their deployed position corresponding to the advanced position of the carriages 48 and 50. FIG. 4 shows the mobile central block 46 and the carriages 48 and 50 in their advanced position, i.e. near. the corresponding transfer plate. The arms 64 and 70 are shown in full line in their deployed position corresponding to the position of the carriages shown in this figure and in chain-dotted line in their deployed position corresponding to the retracted position of the carriages.

The transfer plates 32 and 36 are identical. In the embodiment shown in the drawing, the plates are circular plates disposed in a substantially horizontal plane and pivot about a substantially vertical axis passing through the center of the plate. Each plate 32, 36 has six notches in the example shown, each adapted to receive a stack support 16.

Each notch 78 is in fact a bore at the periphery of the plate having a shoulder 80. The dimensions of the larger diameter bore are such that it can receive a plate 22 of a base 18 of a stack support 16 with virtually no clearance. The smaller diameter bore is sufficiently large to receive a cylindrical foot 20 of a base 18.

As can be seen in the drawing, the bores are fairly close to the periphery of the plate 32 or 36 so that an opening is formed at the periphery of the corresponding plate. The width L of that opening corresponds substantially to the diameter of a foot 20 of a base 18 of a stack support 16.

Accordingly, to be placed in a notch 78, a stack support must first be slipped through an opening into a notch 78 and then lowered in the notch until the plate 22 of the corresponding base 18 rests against the shoulder 80.

To prevent the stack support 16 from dropping suddenly and in an uncontrolled manner into the corresponding notch when it is pushed toward the plate by an arm 64, and also to enable a stack support 16 to be withdrawn when it is pulled by an arm 70, a platform 82 that moves up and down is provided under the transfer plate, on the same side as the loading and offloading system 40. It has an upper face 84 adapted to receive two stack supports 16. The upper face 84 is at the same level as the conveying plane of the conveyors feeding the loading station 10 and the offloading station 14.

Figure 1:
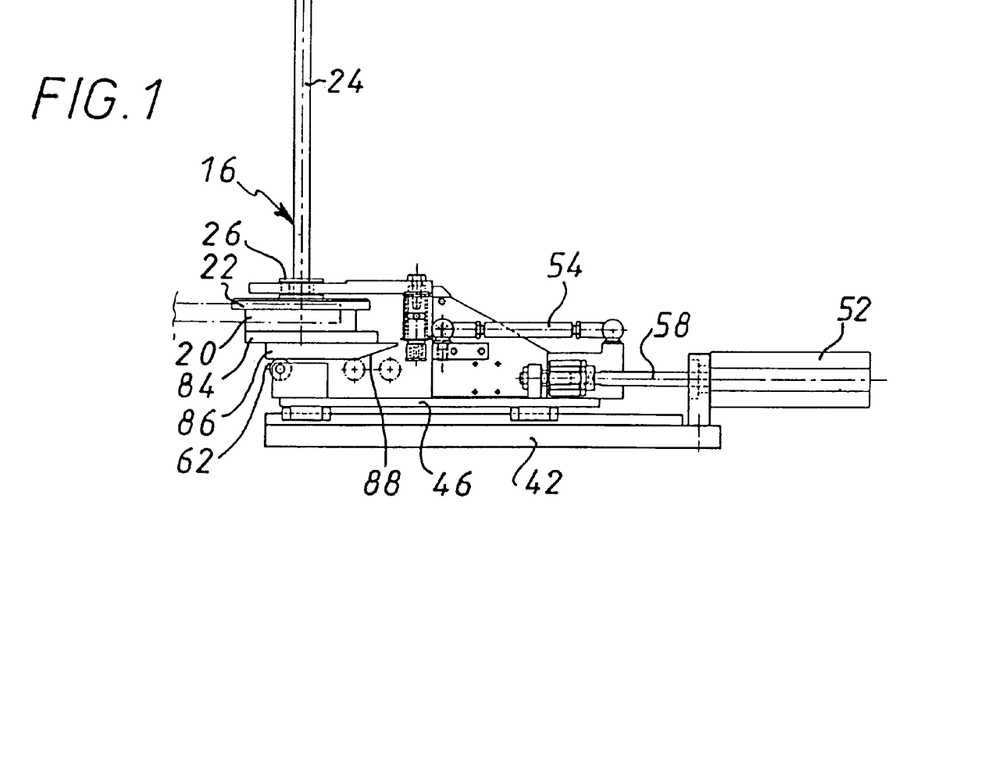
FIG. 1 is a side view of a loading system and a support to be moved.

The platform has a base 86 which incorporates an inclined plate 88 (see FIG. 1) facing the nose 60 of the mobile central block 46 of the loading and offloading system.

FIGS. 6 to 11 show the synchronization of the movement of the carriage 48 and the platform 82 during an operation of loading a stack support onto a transfer plate. The transfer plate 32 is shown here, but the process is exactly the same for the transfer plate 36.

Figure 6:
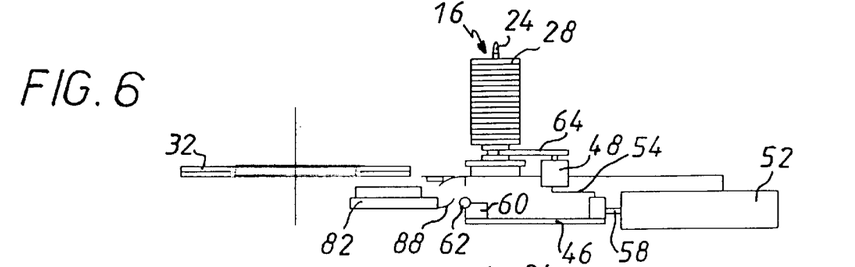

In FIG. 6, the platform 82 is in a lowered position and the carriage 48 is in a retracted position, i.e. away from the transfer plate 32. The piston rod 58 is withdrawn into the piston and cylinder actuator 52. The wheel 62 on the nose 60 of the mobile central block 46 is moved away from the inclined plane 88. The various components are shown diagrammatically in FIG. 6 and in FIGS. 7 to 11 and 12 to 17.

Figure 7:
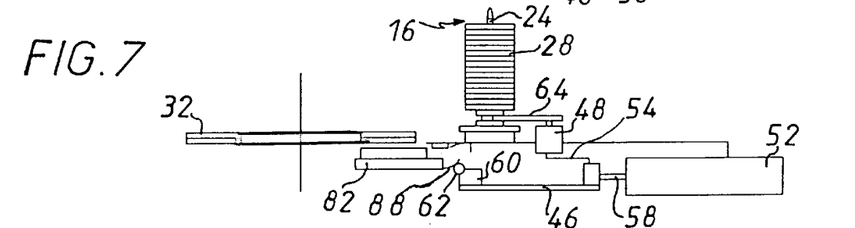
Figure 8:
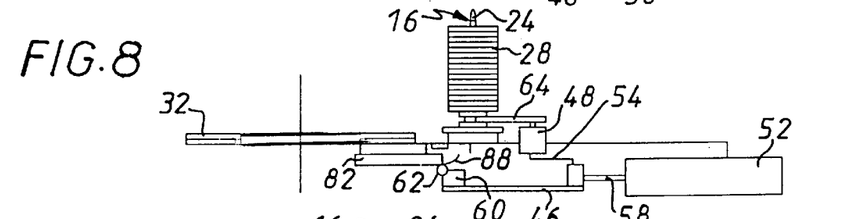

The piston and cylinder actuator 52 is then actuated and the wheel 62 on the nose 60 comes into contact with the inclined plane 88. At the same time, the arm 64 comes into contact with the stack support 16 at the end of the conveyor 30. The notch 66 in the arm 64 is then at the same level as the ring 26 of the stack support 16. FIG. 7 shows this position.

As the piston rod 58 continues to be deployed from the piston and cylinder actuator 52, the wheel 62 comes to bear on the inclined plane 88 and causes the platform 82 to rise. It is guided by pillars that are not shown in the drawing, for example. The central block 46 moved by the piston and cylinder actuator 52 continues to entrain the carriage 48 via the corresponding link 54 and the stack support 16 begins to move toward the transfer plate 32 (see FIG. 8).

Figure 9:
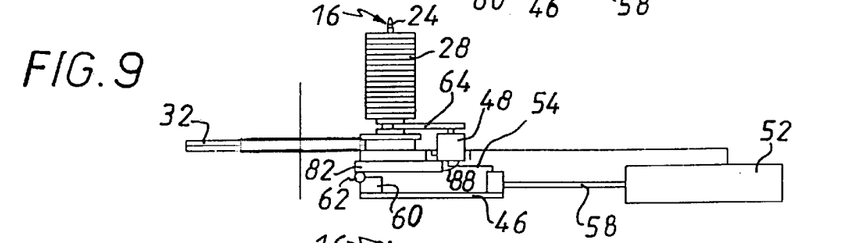

When the piston rod 58 of the piston and cylinder actuator 52 reaches its outermost position, the mobile central block 46 is in its position advanced farthest toward the transfer plate 32 (FIG. 9). The stack support 16 pushed by the arm 64 is then above a notch 78 of the transfer plate 32. The platform 82 is still in a raised position.

Figure 10:
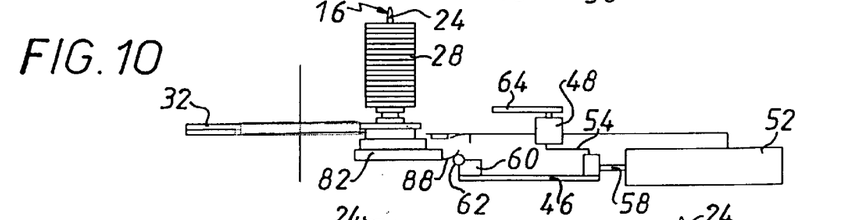

The piston rod 58 of the piston and cylinder actuator 52 then begins to retract into the actuator. The wheel 62 on the nose 60 then slides along the base 86 of the platform 82. The stack support 16 that was previously entrained remains in position on the platform 82 at the level of a notch 74 in the transfer plate 32. The carriage 48 and its associated arm 64 are therefore withdrawn (FIG. 10). It is assumed here that there is no other stack support 16 at the end of the conveyor 30. However, if there were a stack support 16 at the end of the conveyor 30, during the withdrawal movement the arm 64 would retract without in any way impeding the withdrawal movement.

Figure 11:
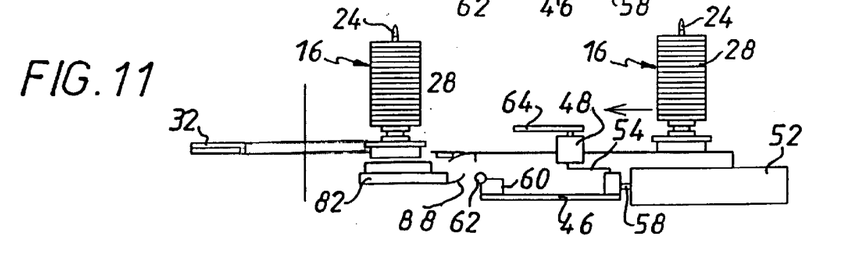

FIG. 11 shows substantially the same position as FIG. 6. The platform 82 is in its lowered position and the block 46 and the carriage 48 are in their retracted position, moved away from the transfer plate 32. When a new stack support 16 arrives, because of the articulation of the arm 64, the stack support 16 can be conveyed to the end of the conveyor 30 without encountering any obstacle, and can therefore be placed in front of the notch 66 of the arm 64 so that it can be entrained on the next movement of the piston and cylinder actuator 52.

FIGS. 12 to 17 show offloading a stack support 16 on the transfer plate 32. The loading and offloading system 40 shown in these figures is the same system as that shown in FIGS. 6 to 11. The movement of the mobile central block 46 and the platform 82 is the same as that previously described. FIGS. 6 to 11 respectively show the same movements as FIGS. 12 to 17.

Figure 12:
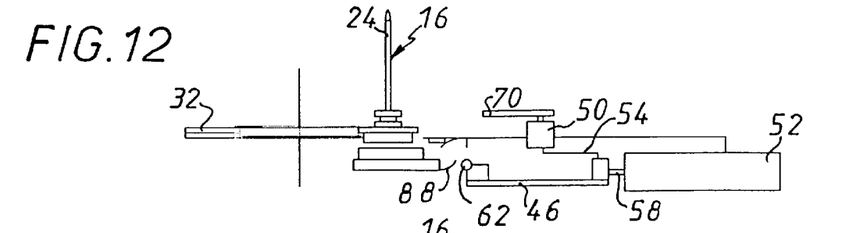
FIGS. 12 to 17 are diagrammatic views corresponding to FIGS. 6 to 11 and showing the offloading of a support.
Figure 13:
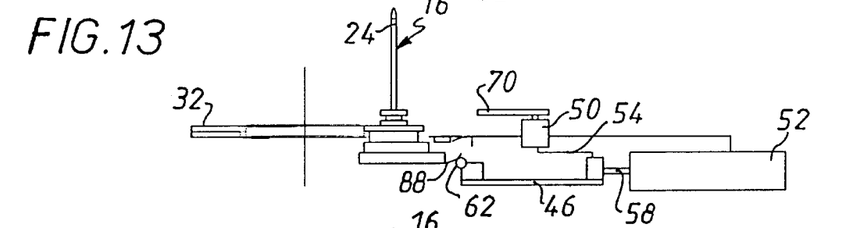
Figure 14:
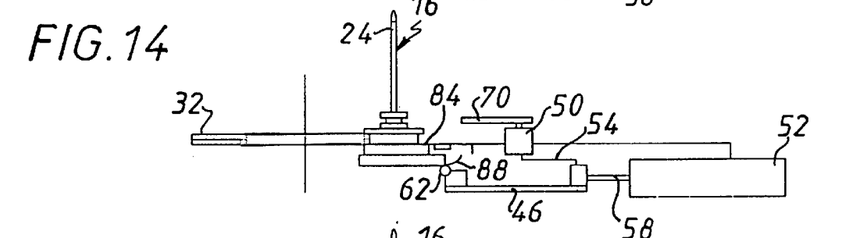
Figure 15:
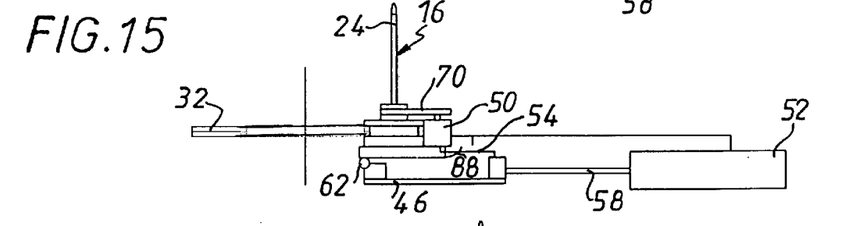
Figure 16:
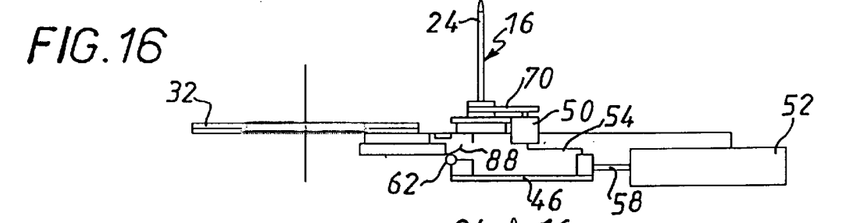

In FIG. 12, the carriage 50 and its arm 70 are in a retracted position relative to the transfer plate 32. The stack support 16 is empty in the corresponding notch 78 of the plate 32. When the piston rod 58 moves out of the piston and cylinder actuator 52, the wheel 62 on the nose 60 comes into contact with the inclined plate 88 (FIG. 13). The nose 60 and its wheel 62 then lift the platform 82 until its upper face 84 comes into contact with the base 18 of the stack support 16. The latter then rests on the platform 82 (FIG. 14). As the forward movement of the carriage 50 continues, the arm 70 is retracted so that the notch 74 on the arm is placed in front of the ring 26 of the stack support 16 (FIG. 15).

Figure 17:
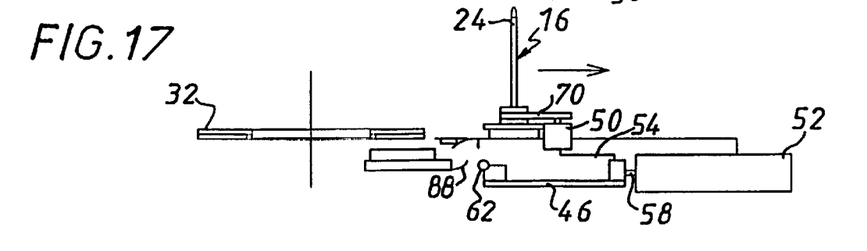

During the withdrawal movement of the carriage 50, the stack support 16 is then entrained by the arm 70 toward the corresponding conveyor. Once in position on the conveyor, the latter entrains the stack support 16 (FIG. 17). The empty stack support 16 is then conveyed by an appropriate conveyor system to the other loading and offloading system 40 in order to be placed on the second transfer plate 36, as explained above.

The scope of the present invention is not limited to the details of the embodiment discussed above by way of non-limiting example, but on the contrary extends to modifications that will be evident to the skilled person, in the context of the following claims.

For example, the loading and offloading systems described above could be used with a machine other than a printing machine.

If, in a different machine, it is necessary only to perform loading or offloading, this can equally be carried out using a system according to the invention. In this case, a single carriage may be sufficient and it is then unnecessary to provide a central block and a second carriage, or obviously any link. The piston and cylinder actuator would then act directly on the carriage performing the loading or offloading.

The shape of the arms shown in the drawings and described above is in no way limiting on the invention. This is a preferred embodiment enabling good retraction of the arms when they encounter an obstacle.

The arms described above are inclined toward the front of the system, i.e. toward the transfer plate. The arms in their deployed position could equally well extend substantially perpendicular to the direction of movement of the carriage carrying them. An inclination toward the rear is also feasible. It is sufficient in all cases to adapt the travel of the carriage and the relative position of the various components.

What is claimed is:

1. A system between a conveyor and a machine for loading and/or offloading a support for objects adapted to be stacked, which system includes:

a carriage mobile in translation between a retracted position in which the carriage is moved away from the machine and an advanced position in which the carriage is close to the machine, the direction of movement of the carriage being substantially horizontal, an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and a spring return system spring-loading the arm toward its deployed position.

2. The loading and/or offloading system claimed in claim 1, wherein the carriage cooperates with a platform adapted to receive the support for objects adapted to be stacked when it is loaded onto the machine or offloaded therefrom, either the carriage or the platform having an inclined plane with which the other one cooperates.

3. The loading and/or offloading system claimed in claim 2, wherein either the carriage or the platform has an idler wheel adapted to cooperate with the inclined plane on the other one.

4. The loading and/or offloading system claimed in claim 1, including a rotating transfer plate provided with housings each adapted to receive a support adapted to be moved from the conveyor toward the transfer plate or vice versa.

5. A loading and offloading system including two systems between a conveyor and a machine for loading and/or offloading a support for objects adapted to be stacked, wherein each of said two systems includes:

a carriage mobile in translation between a retracted position in which the carriage is moved away from the machine and an advanced position in which the carriage is close to the machine, the direction of movement of the carriage being substantially horizontal, an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and a spring return system spring-loading the arm toward its deployed position, the carriages of the two systems being interconnected and moved by a common actuator.

6. The loading and offloading system claimed in claim 5, wherein each carriage is mounted to slide on a guide rail and the two guide rails are fastened together by a base.

7. The loading and offloading system claimed in claim 6, wherein the base is substantially triangular, the carriages are disposed on respective opposite sides of the base, their guide rails form two sides of the triangle, and each carriage is connected by a variable-length link to a mobile central block moved by an actuator.

8. The loading and offloading system claimed in claim 5, wherein the mobile central unit has on its front part, i.e. on the same side as the machine, an idler wheel adapted to cooperate with an inclined plane disposed under a platform adapted to receive the support for objects adapted to be stacked when the latter is loaded onto the machine or discharged therefrom.

9. A station for loading and offloading supports for objects adapted to be stacked, including a conveyor, a rotating transfer plate provided with housings each adapted to receive a support, and a system for moving a support from the conveyor toward the transfer plate or vice versa, wherein the system for moving a support includes:

a carriage mobile in translation between a retracted position in which the carriage is moved away from the machine and an advanced position in which the carriage is close to the machine, the direction of movement of the carriage being substantially horizontal, an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and a spring return system spring-loading the arm toward its deployed position.

10. A station for loading and offloading supports for objects adapted to be stacked, including a conveyor, a rotating transfer plate provided with housings each adapted to receive a support, and a system for moving a support from the conveyor toward the transfer plate or vice versa, wherein the system for moving a support includes a loading and offloading system including two systems between a conveyor and a machine for loading and/or offloading a support for objects adapted to be stacked, wherein each system includes:

a carriage mobile in translation between a retracted position in which the carriage is moved away from the machine and an advanced position in which the carriage is close to the machine, the direction of movement of the carriage being substantially horizontal, an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and a spring return system spring-loading the arm toward its deployed position, the carriages of the two systems being interconnected and moved by a common actuator.

11. The loading and offloading station claimed in claim 10, wherein the supports to be moved each have a base having a circular cylindrical foot on which is placed a circular plate of greater diameter than the foot, wherein the housings of the transfer plate adapted to receive a support open onto the periphery of the plate and therefore provide a lateral opening for each housing, the resulting openings enabling radial introduction of a support foot but preventing radial introduction of a circular support plate.

12. The loading and offloading station claimed in claim 11, wherein each housing has a peripheral shoulder defining two bores of different diameters, the bore of larger diameter being adapted to receive a support plate with the smallest possible clearance and the bore of smaller diameter being adapted to receive a support foot.

13. The loading and offloading station claimed in claim 9, including a platform under the transfer plate, facing the loading and offloading system and having a substantially horizontal upper face adapted to receive a support, mobile in translation in a substantially vertical direction between a top position in which the upper face of the platform is substantially in the plane in which the supports are conveyed and a bottom position in which the upper face is below a support foot without touching the latter when the support is placed in its housing on the rotating plate.

14. A printing machine including a circular contour printing table which has a plurality of object-stations regularly distributed around its periphery each adapted to receive an object to be printed, a loading station and an offloading station, wherein at least one loading and/or offloading station includes a loading and/or offloading system between a conveyor and a machine for loading and/or offloading a support for objects adapted to be stacked, which includes:

- a carriage mobile in translation between a retracted position in which the carriage is moved away from the machine and an advanced position in which the carriage is close to the machine, the direction of movement of the carriage being substantially horizontal,
- an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and
- a spring return system spring-loading the arm toward its deployed position.

15. A printing machine including a circular contour printing table which has a plurality of object-stations regularly distributed around its periphery each adapted to receive an object to be printed, a loading station and an offloading station, wherein at least one loading and/or offloading station includes a loading and offloading system including two systems between a conveyor and a machine for loading and/or offloading a support for objects adapted to be stacked, wherein each system includes:

- a carriage mobile in translation between a retracted position in which the carriage is moved away from the machine and an advanced position in which the carriage is close to the machine, the direction of movement of the carriage being substantially horizontal,
- an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and
- a spring return system spring-loading the arm toward its deployed position, the carriages of the two systems being interconnected and moved by a common actuator.

16. The printing machine claimed in claim 15, including two transfer plates, wherein each transfer plate is associated with a loading and offloading system including two systems between a conveyor and a machine for loading and/or offloading a support for objects adapted to be stacked, wherein each system includes:

- a carriage mobile in translation between a retracted position in which the carriage is moved away from the machine and an advanced position in which the carriage is close to the machine, the direction of movement of the carriage being substantially horizontal,
- an arm adapted to push or pull a support, having at its free end a shape suitable for the support to be moved, and mounted on the carriage and articulated about a substantially vertical shaft, between a deployed position in which the free end of the arm is on the trajectory of a support and a retracted position folded toward the carriage, and
- a spring return system spring-loading the arm toward its deployed position, the carriages of the two systems being interconnected and moved by a common actuator, and wherein a conveyor is provided for feeding supports to a first loading and offloading system, a system is provided for conveying empty supports offloaded from the first transfer plate by the first loading and offloading system to the second loading and offloading system in order to be loaded onto the second transfer plate, and a second conveyor is provided for filled supports offloaded from the second transfer plate by the second loading and offloading system.

* * * * *